United States Patent
Smith et al.

(10) Patent No.: US 6,437,007 B1
(45) Date of Patent: Aug. 20, 2002

(54) AEROGEL THIN FILM FORMATION FROM MULTI-SOLVENT SYSTEMS

(75) Inventors: Douglas M. Smith; Gregory P. Johnston; William C. Ackerman, all of Albuquerque, NM (US); Shin-Puu Jeng, Plano; Bruce E. Gnade, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/549,289

(22) Filed: Apr. 14, 2000

Related U.S. Application Data

(62) Division of application No. 08/746,679, filed on Nov. 14, 1996, now Pat. No. 6,130,152.
(60) Provisional application No. 60/006,853, filed on Nov. 16, 1995.

(51) Int. Cl.$^7$ .............................. B01F 3/12; C01B 33/14
(52) U.S. Cl. ...................... 516/31; 106/287.34; 501/12; 516/34
(58) Field of Search ................ 516/31, 34; 106/287.34; 501/12

(56) References Cited

U.S. PATENT DOCUMENTS

| | | | |
|---|---|---|---|
| 2,455,367 A | * 12/1948 | King ................ | 106/287.34 X |
| 3,652,216 A | 3/1972 | Krekeler et al. | |
| 3,689,637 A | 9/1972 | Pader | |
| 3,832,204 A | * 8/1974 | Boaz ................ | 106/287.34 X |
| 3,860,431 A | 1/1975 | Payne et al. | |
| 3,997,501 A | 12/1976 | McLeod | |
| 4,104,363 A | 8/1978 | Vozka et al. ............... | 423/338 |
| 4,169,926 A | 10/1979 | McDaniel .................. | 526/100 |
| 4,230,773 A | 10/1980 | Bakos ....................... | 428/447 |
| 4,230,803 A | 10/1980 | Weidenbach et al. ...... | 435/176 |
| 4,311,738 A | 1/1982 | Chi ............................ | 427/387 |
| 4,432,956 A | * 2/1984 | Zarzycki et al. ........... | 501/12 X |
| 4,548,646 A | 10/1985 | Mosser et al. ........... | 106/14.12 |
| 4,584,365 A | 4/1986 | Jada et al. .................. | 528/271 |
| 4,608,316 A | 8/1986 | Toda et al. ................. | 428/446 |
| 4,652,467 A | 3/1987 | Brinker et al. ............. | 427/246 |
| 4,713,233 A | 12/1987 | Marsh et al. .............. | 423/608 |
| 4,851,150 A | 7/1989 | Hench et al. ............. | 252/315.6 |
| 4,943,542 A | 7/1990 | Hayashi et al. ............ | 501/12 |
| 4,954,327 A | 9/1990 | Blount ....................... | 423/338 |
| 4,987,101 A | 1/1991 | Kaanta et al. .............. | 437/228 |
| 5,076,980 A | 12/1991 | Nogues et al. ............. | 264/65 |
| 5,091,009 A | 2/1992 | Nogami et al. .......... | 106/287.23 |
| 5,097,317 A | 3/1992 | Fujimoto et al. ........... | 357/72 |
| 5,103,288 A | 4/1992 | Sakamoto et al. .......... | 357/71 |
| 5,139,980 A | 8/1992 | Nakahara et al. ........... | 501/12 |
| 5,155,576 A | 10/1992 | Mizushima .................. | 357/71 |
| 5,192,364 A | * 3/1993 | Inoue et al. .............. | 501/12 X |
| 5,207,814 A | 5/1993 | Cogliati et al. ............. | 65/18.3 |
| 5,226,930 A | 7/1993 | Sasaki ........................ | 51/308 |
| 5,242,647 A | 9/1993 | Poco ........................... | 264/225 |
| 5,270,027 A | 12/1993 | Balducci et al. ............ | 423/338 |
| 5,275,796 A | 1/1994 | Tillotson et al. ............ | 423/338 |
| 5,294,480 A | 3/1994 | Mielke et al. ............... | 428/240 |
| 5,302,548 A | 4/1994 | Watanabe et al. ........... | 437/187 |
| 5,320,983 A | 6/1994 | Ouellet ....................... | 437/231 |
| 5,352,637 A | 10/1994 | Fabry et al. ................. | 437/238 |
| 5,368,887 A | 11/1994 | Hoshino et al. ............ | 427/226 |
| 5,391,364 A | 2/1995 | Cogliati ...................... | 423/335 |
| 5,393,712 A | 2/1995 | Rostoker et al. ............ | 437/238 |
| 5,403,368 A | * 4/1995 | Takahashi et al. ........ | 501/12 X |
| 5,405,805 A | 4/1995 | Homma ..................... | 437/195 |
| 5,409,683 A | 4/1995 | Tillotson et al. ............ | 423/338 |
| 5,457,073 A | 10/1995 | Ouellet ....................... | 437/231 |
| 5,470,802 A | 11/1995 | Gnade et al. ............... | 437/238 |
| 5,472,913 A | 12/1995 | Havemann et al. ......... | 437/195 |
| 5,488,015 A | 1/1996 | Havemann et al. ......... | 437/195 |
| 5,489,553 A | 2/1996 | Chen .......................... | 437/195 |
| 5,494,858 A | 2/1996 | Gnade et al. ............... | 437/231 |
| 5,494,863 A | 2/1996 | Mathur ........................ | 501/12 |
| 5,496,527 A | 3/1996 | Yokogawa et al. ......... | 423/338 |
| 5,504,042 A | 4/1996 | Cho et al. ................... | 437/247 |
| 5,519,250 A | 5/1996 | Numata ...................... | 257/632 |
| 5,522,976 A | 6/1996 | Campet et al. ........ | 204/298.13 |

(List continued on next page.)

FOREIGN PATENT DOCUMENTS

| | | |
|---|---|---|
| EP | 0 382 310 A2 | 8/1990 |
| EP | 0 454 239 A2 | 10/1991 |
| JP | A-54 109765 | 8/1979 |
| JP | A-06 293971 | 10/1994 |
| WO | WO 92/03378 | 3/1992 |

OTHER PUBLICATIONS

Tillotson et al., "Transparent ultralow–density silica aerogels prepared by a two–step sol–gel process", Journal of Non–Crystalline Solids, 145 (1992), pp. 44–50.

(List continued on next page.)

*Primary Examiner*—Richard D. Lovering
(74) *Attorney, Agent, or Firm*—Wade James Brady, III; Frederick J. Telecky, Jr.

(57) ABSTRACT

This invention pertains generally to precursors and deposition methods suited to aerogel thin film fabrication. An aerogel precursor sol which contains an oligomerized metal alkoxide (such as TEOS), a high vapor pressure solvent (such as ethanol) and a low vapor pressure solvent (such as water and 1-butanol) is disclosed. By a method according to the present invention, such a precursor sol is applied as a thin film to a semiconductor wafer, and the high vapor pressure solvent is allowed to evaporate while evaporation of the low vapor pressure solvent is limited, preferably by controlling the atmosphere adjacent to the wafer. The reduced sol is then allowed to gel at a concentration determined by the ratio of metal alkoxide to low vapor pressure solvent. One advantage of the present invention is that it provides a stable, spinnable sol for setting film thickness and providing good planarity and gap fill for patterned wafers. In addition, however, the reduced sol may be gelled rapidly from a known sol concentration keyed to the desired final density of the aerogel thin film and largely independent of film thickness and spin conditions.

8 Claims, 2 Drawing Sheets

U.S. PATENT DOCUMENTS

| | | | |
|---|---|---|---|
| 5,523,615 A | 6/1996 | Cho et al. .................... | 257/632 |
| 5,525,857 A | 6/1996 | Gnade et al. ............... | 313/309 |
| 5,536,965 A | 7/1996 | Beratan et al. ............. | 257/444 |
| 5,548,159 A | 8/1996 | Jeng ........................... | 257/634 |
| 5,561,318 A | 10/1996 | Gnade et al. ............... | 257/638 |
| 5,656,848 A | 8/1997 | Beratan et al. ............. | 257/446 |
| 5,661,334 A | 8/1997 | Havemann et al. .......... | 257/758 |
| 5,698,483 A | 12/1997 | Ong et al. .................... | 501/12 |
| 5,723,368 A | 3/1998 | Cho et al. .................... | 437/763 |
| 5,736,425 A | 4/1998 | Smith et al. ................. | 438/778 |
| 5,746,992 A | 5/1998 | Yoldas et al. ............... | 423/338 |
| 5,747,880 A | 5/1998 | Havemann et al. .......... | 257/759 |
| 5,750,415 A | 5/1998 | Gnade et al. ............... | 427/195 |
| 5,753,305 A | 5/1998 | Smith et al. ................. | 427/335 |
| 5,789,819 A | 8/1998 | Gnade et al. ............... | 257/759 |
| 5,804,508 A | 9/1998 | Gnade et al. ............... | 438/778 |
| 5,807,607 A | 9/1998 | Smith et al. .................. | 427/96 |
| 5,847,443 A | 12/1998 | Cho et al. .................... | 257/632 |
| 5,858,871 A | 1/1999 | Jeng ........................... | 438/623 |
| 5,955,140 A | 9/1999 | Smith et al. .................. | 427/96 |
| 6,037,277 A | 3/2000 | Maskara et al. ............. | 438/787 |
| 6,063,714 A | 5/2000 | Smith et al. ................. | 438/778 |
| 6,130,152 A | 10/2000 | Smith et al. ................. | 438/622 |
| 6,159,295 A | 12/2000 | Maskara et al. ............. | 178/688 |
| 6,171,645 B1 | 1/2001 | Smith et al. .................. | 427/96 |

OTHER PUBLICATIONS

D. Basmadjian et al., "The Control of the Pore Volume and Pore Size Distribution in Alumina and Silica Gels by the Addition of Water Soluble Organic Polymers", Dec. 1962, Journal of Catalysis, vol. 1, No. 6, pp. 547–563.

Fricke et al., "Aerogels", May 28, 1992, J. Am. Ceram. Soc., 75(8), pp. 2027–2036.

Einarsrud et al., Chem. Process. Adv. Matl., (1992) pp. 355–361. (abstract only).

Haereid, Siv et al., "Mechanical Strenthening of TMOS-Based Alcogels by Aging in Silane Solutions", 1994, Journal of Sol–Gel Science and Tech., vol. 3, pp. 199–204.

Haereid, Siv, "Preparation and Characterization of Transparent, Monolithic Silica Xerogels with Low Density", Jan. 1993, Norwegian Institute fo Technology, Dept. of Inorganic Chemistry.

Hrubesh et al., "Dielectric Properties of Aerogels", J. Materials Research, vol. 8, No. 7, Jul. 1993, pp. 1736–1741.

V. S. Klimenko, L. A. Kulik, and V. V. Vashchinskaya, "Dependence of the Composition and Structure of Silicic Acid Xerogels on the Nature of the Solvent", 1986, Ukrainskii Khimicheskii Zhurnal, vol. 52, No. 12, pp. 1247–1251.

Smith et al., "Preparation of low–denksity xerogels at ambient pressure", Journal of Non–Crystalline Solids, 186 (1995) pp. 104–112.

Yokogawa, H., Yokoyama, M., "Hydrophobic Silica Aerogels", Journal of Non–Crystalline Solids, 186 (1995) pp. 23–29.

Poco et al., "A rapid Supercritical Extraction Process for the Production of Silica Aerogels", Mat. Res. Soc. Symp. Proc. vol. 431 (1996) pp. 297–302, Materials Research Society.

Prakash et al., "Ambient–Pressure silica Aerogel Films", Mat. Res. Soc. Symp. Proc. Vol. 371 (1995) pp. 205–210, Materials Research Society.

Smith et al., "Preparation of Low–Density Xerogels at Ambient Pressure for Low K Dielectrics", Mat. Res. Soc. Symp. Proc. vol. 371 (1995) pp. 261–272, Materials Research Society.

U.S. patent application Ser. No. 08/746,688 filed Nov. 14, 1996.

U.S. patent application Ser. No. 08/748,927 filed Nov. 14, 1996.

U.S. patent application Ser. No. 09/178,715 filed Oct. 26, 1998.

U.S. patent application Ser. No. 09/324,370 filed Jun. 02, 1999.

U.S. patent application Ser. No. 09/488,185 filed Jan. 20, 2000.

U.S patent application Ser. No. 09/573,564 filed May 19, 2000.

U.S. patent application Ser. No. 09/757,073 filed Jan. 08, 2001.

* cited by examiner

AEROGEL THIN FILM FORMATION FROM MULTI-SOLVENT SYSTEMS

This application is a Divisional of Application Ser. No. 08/746,679 filed Nov. 14, 1996, now U.S. Pat. No. 6,130,152 which claims priority under 35 USC § 119(e)(1) of Provisional Application Ser. No. 60/006,853 filed Nov. 16, 1995.

FIELD OF THE INVENTION

This invention pertains generally to precursors and deposition methods for low dielectric constant thin films on semiconductor substrates, and more particularly to such precursors and deposition methods suited to aerogel thin film fabrication.

BACKGROUND OF THE INVENTION

Sol-gel techniques are commonly used to produce dense thin films in semiconductor fabrication. The word sol-gel, however, does not describe a product but a reaction mechanism whereby a sol may be transformed into a gel. A sol is a colloidal suspension of solid particles in a liquid; one method of forming a sol is through hydrolysis and condensation reactions which cause a multifunctional monomer in a solution to polymerize into relatively large, highly branched particles.

Many monomers suitable for polymerization are metal alkoxides. For example, a tetraethylorthosilicate (TEOS) monomer may be partially hydrolyzed in water by the reaction

$$Si(OEt)_4 + H_2O \rightarrow HO\text{---}Si(OEt)_3 + EtOH$$

Reaction conditions may be controlled such that, on the average, each monomer undergoes a desired number of hydrolysis reactions to partially or fully hydrolyze the monomer; TEOS which has been fully hydrolyzed becomes $Si(OH)_4$. Once a molecule has been at least partially hydrolyzed, two molecules can then link together in a condensation reaction, such as

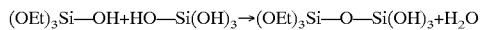
$$(OEt)_3Si\text{---}OH + HO\text{---}Si(OH)_3 \rightarrow (OEt)_3Si\text{---}O\text{---}Si(OH)_3 + H_2O$$

or

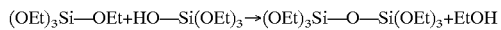
$$(OEt)_3Si\text{---}OEt + HO\text{---}Si(OEt)_3 \rightarrow (OEt)_3Si\text{---}O\text{---}Si(OEt)_3 + EtOH$$

to form an oligomer and liberate a molecule of water or ethanol. The Si—O—Si configuration in the oligomer formed by these reactions has three sites available at each end for further hydrolysis and condensation; thus additional monomers or oligomers can be added to this molecule in a somewhat random fashion to create a highly branched polymeric molecule from literally thousands of monomers.

Through continued reactions, one molecule in the sol may eventually reach macroscopic dimensions so that it forms a network which extends throughout the sol; at this point (called the gel point), the substance is said to be a gel. By this definition, a gel is a substance that contains a continuous solid skeleton enclosing a continuous liquid phase. As the skeleton is porous, a gel can also be described as an open-pored solid structure enclosing a pore fluid. An oligomerized metal alkoxide, as defined herein, comprises molecules formed from at least two alkoxide monomers, but does not comprise a gel.

An ungelled sol may be dip-coated or spin-coated onto a substrate to form a thin film on the order of several microns or less in thickness, gelled, and dried. In practice, such a thin film is subjected to rapid evaporation of volatile components, to the extent that the deposition, gelation, and drying phases may all be taking place at once as the film collapses rapidly to a dense film. Drying by evaporation of the pore fluid produces extreme capillary pressure in the microscopic pores of the wet gel, causing many pores to collapse and the gel to be reduced in volume as it dries, typically by an order of magnitude or more.

A dried gel which is formed by collapsing and densifying a wet gel during drying is termed a xerogel. A thin film xerogel is usually dense, with just a few percent porosity remaining after drying. U.S. patent application Ser. #08/247,195 now U.S. Pat. No. 5,470,802, to Gnade, Cho and Smith discloses a process for producing an aerogel thin film on a semiconductor substrate; an aerogel thin film is distinguishable from a xerogel thin film primarily by a manner of drying which largely avoids pore collapse during drying of the wet gel; this results in a substantially undensified thin film which can be fabricated with almost any desired porosity (thin films with greater than 90% porosity have been demonstrated). Such films have been found to be desirable for a low dielectric constant insulation layer in microelectronic applications.

SUMMARY OF THE INVENTION

The present invention provides an aerogel precursor sol and a method for deposition of aerogel thin films, e.g. for microelectronic applications. For such applications, the precise control of film thickness and aerogel density are desirable. Several important properties of the film are related to the aerogel density, including mechanical strength, pore size and dielectric constant. It has now been found that both aerogel density and film thickness are related to the viscosity of the sol at the time it is spun onto a wafer; this presents a problem which was heretofore unrecognized, the problem being that with conventional precursor sols and deposition methods, it is extremely difficult to control both aerogel density and film thickness independently and accurately.

Aerogel thin films may be deposited on patterned wafers, e.g. over a level of patterned conductors. It has now been recognized that sol deposition should be completed prior to the onset of gelation to insure that gaps between such conductors remain adequately filled and that the surface of the gel remains substantially planar. To this end, it is also desirable that no significant evaporation of pore fluid occur during gelation. Unfortunately, it is also desirable that the gel point be reachable as soon after deposition as possible to simplify processing, and the conventional method for speeding gelation of thin films is to allow evaporation to occur. It is recognized herein that a suitable precursor sol for aerogel deposition should allow control of film thickness, aerogel density, gap fill and planarity, and be relatively stable prior to deposition, and yet gel relatively soon after deposition without substantial evaporation.

A method has now been found which allows controlled deposition of aerogel thin films from a multi-solvent precursor sol. In this method, sol viscosity and film thickness may be controlled relatively independently. This allows film thickness to be rapidly changed from a first known value to a second known value which can be set by solvent ratios and spin conditions, thus keeping film thickness largely independent of aerogel density and allowing rapid gelation. However, at the same time, the solid:liquid ratio present in the film at the gel point (and therefore the aerogel density) can be accurately determined in the precursor sol prior to deposition, independent of spin conditions and film thickness.

An aerogel precursor sol particularly suited for microelectronic thin film fabrication is disclosed herein. The aerogel precursor sol comprises an oligomerized metal alkoxide, particulate or colloidal metal oxides, and/or organic precursor dispersed in a high volatility solvent and a low volatility solvent, the high volatility solvent having a vapor pressure higher than the vapor pressure of the low volatility solvent. In this sol, the low volatility solvent to metal alkoxide ratio preferably is set to a value capable of forming a gel of a desired density. The high volatility solvent preferably has a ratio to low volatility solvent required to maintain a specified viscosity for the precursor sol.

The high volatility solvent is preferably selected from the group consisting of methanol, ethanol, ketones and combinations thereof. As the low volatility solvent generally comprises at least some water, it is preferable that the low volatility components be water miscible. The low volatility solvent is preferably selected from the group consisting of water, 1-propanol, 2-propanol, 1-butanol, 2-butanol, tert-butanol, 2-pentanol, 3-pentanol and combinations thereof.

In another aspect of the invention, a method of forming a porous dielectric on a semiconductor substrate is disclosed. This method may comprise the step of depositing a thin film of an aerogel precursor sol on a semiconductor substrate; the sol comprises an oligomerized metal alkoxide dispersed in a first solvent and a second solvent. The method further comprises preferentially evaporating substantially all of the first solvent from the thin film, preferably without substantial evaporation of the second solvent, and subsequently cross-linking the thin film to form a wet gel having pores arranged in an open-pored structure on the semiconductor substrate. Preferably, the first solvent has a vapor pressure which is higher than the vapor pressure of the second solvent such that it may be removed via differential evaporation rate; this rate may be enhanced by performing the preferential evaporation step in a controlled atmosphere having a partial pressure of the second solvent.

BRIEF DESCRIPTION OF THE DRAWINGS

The present invention, including various features and advantages thereof, may be best understood with reference to the following drawings, wherein.

DETAILED DESCRIPTION OF THE PREFERRED EMBODIMENTS

Typical sol-gel thin film processes produce gels which collapse and density upon drying, thus forming xerogels having only a few percent porosity. Under the uncontrolled drying conditions of xerogel film formation, it has been neither critical nor possible to completely separate the deposition, aggregation, gelation, and drying steps during formation of the thin film, as the entire process may be completed in a few seconds. However, it has now been found that such methods are generally unsuited for depositing high porosity thin films with a controllable low density; because in an aerogel type drying process, the film remains substantially undensified after drying, its final density is largely determined by the solid:liquid ratio in the film at the gel time. It has now been discovered that the following criteria are desirable for aerogel thin film deposition, particularly where the thin film is required to planarize and/or gap fill a patterned wafer:

1) an initial viscosity suitable for spin-on application
2) stable viscosity at deposition
3) stable film thickness at gel time
4) a predetermined solid:liquid ratio at gel time
5) gelation shortly after deposition No prior art precursor sol and method have been found which meet these conditions. However, in accordance with the present invention, it has now been found that a sol prepared with at least two solvents in specific ratios may be used to meet these conditions. The method of depositing and gelling such a precursor sol can be best understood with reference to FIG. 1.

Figure 1:
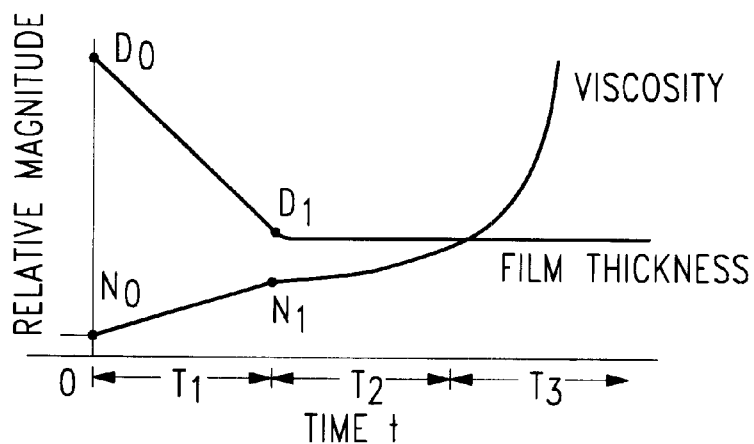
FIG. 1 contains a graph of relative film thickness and relative film viscosity as a function of time for one embodiment of the present invention.

As shown in FIG. 1 for time t=0, a multi-solvent precursor sol may be spun onto a wafer at an initial film thickness $D_0$ and an initial viscosity $\eta_0$. This is preferably done in a controlled atmosphere having a partial pressure of the second solvent which greatly retards evaporation of the second solvent from the wafer. Thus after spin-on application, the first solvent is preferentially removed from the wafer during evaporation time period $T_1$ while the second solvent is maintained, thereby decreasing the film thickness to $D_1$. Viscosity also changes during this time to $\eta_1$, preferably due primarily to the removal of solvent (generally little cross-linking of polymeric clusters in the sol occurs during this time). At the end of $T_1$, substantially all of the first solvent should be evaporated, at which time film thickness should stabilize or proceed to shrink at a much reduced rate, thereby providing a predetermined liquid:solid ratio and thickness for the thin film at gel time.

Time period $T_2$ has the primary purpose of providing separation between the endpoint of evaporation time period $T_1$ and the gel point which occurs during gelation time period $T_3$. Time period $T_2$ may therefore be set to 0, although some finite nonzero period is preferred. Additionally, during time period $T_1$ or $T_2$ a vapor-phase catalyst such as ammonia may be introduced into the controlled atmosphere; this catalyst may diffuse into the thin film, further activating the sol and promoting rapid cross-linking.

Although little or no evaporation preferably takes place during $T_2$, viscosity should begin to increase substantially as cross-linking continues to link polymeric clusters. The viscosity increases as the polymers grow and aggregate, in part because the liquid within a polymeric cluster is not available for flow.

Evaporation near the gel point may result in poor gap-fill and planarity for patterned wafers. Consequently, during gelation time period $T_3$, film thickness is preferably held nearly constant until the gel point has passed by limiting evaporation. Sometime during time period $T_3$, a marked change in viscosity occurs as the sol nears the gel point, where large polymeric clusters finally join to create a spanning cluster which is continuous across the thin film.

Several advantages of the present invention are apparent from FIG. 1. Sol viscosity and film thickness are both allowed to change rapidly, but generally not at the same time. Also, film thickness is changed from a first known value to a second known value which can be independently set by solvent ratios and spin conditions. Using this method, a low viscosity film may be applied, quickly reduced to a preset thickness, and rapidly gelled at a desired density.

Figure 2A:
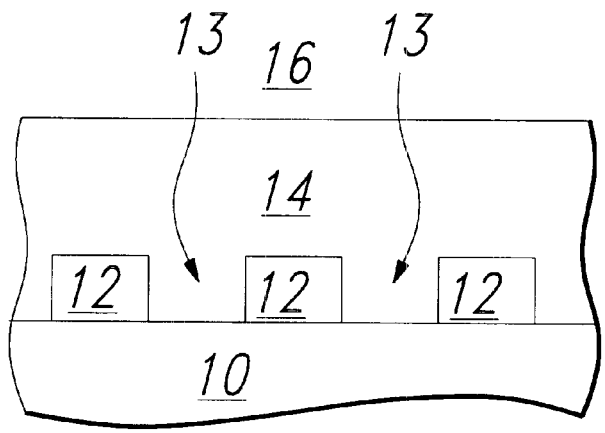
FIGS. 2A–2B contain cross-sections of a semiconductor substrate at several points during deposition of a thin film according to the present invention.

Referring now to FIG. 2A, a semiconductor substrate 10 (typically in wafer form) is shown. Common substrates include silicon, germanium, and gallium arsenide, and the substrate may include active devices, lower level wiring and insulation layers, and many other common structures not shown but known to those skilled in the art. Several patterned conductors 12 (e.g. of an Al-0.5%Cu composition) are shown on substrate 10. Conductors 12 typically run parallel for at least part of their length, such that they are separated by gaps 13 of a predetermined width (typically a fraction of a micron). Both the conductors and gaps may have height-to-width ratios much greater than shown, with larger ratios typically found in devices with smaller feature sizes.

In accordance with one embodiment of the present invention, a stock solution may be prepared by combining TEOS, ethanol, water and HCI in the approximate molar ratio 1:3:1:0.0007 and refluxing this solution for 1.5 hours at 80° C. to form a sol. The sol is further diluted using at least two solvents which differ in volatility, for example, ethanol (v.p.=89 torr @ 32° C.) and 1-butanol (v.p.=31 torr @ 32° C.) in molar ratios of solvent:TEOS of 5:1 and 10:1, respectively to form a multi-solvent precursor sol. Volume ratios of ethanol and 1-butanol may be adjusted to any desired ratio depending on desired film thickness and density.

3–5 ml of this multi-solvent precursor sol may be dispensed at room temperature onto substrate 10, which is then spun at 1500 to 5000 rpm (depending on desired film thickness) for about 5–10 seconds to form sol thin film 14. This is preferably done in a saturated 1-butanol and water atmosphere 16. This permits rapid evaporation of the ethanol from film 14 without substantial evaporation of the 1-butanol and water. An additional advantage of selecting ethanol as a high vapor-pressure solvent in a TEOS-based sol is that ethanol is a reaction product in hydrolysis and condensation; thus simply removing ethanol from the sol may shift the equilibrium point and speed gelation of the film (conversely, the low vapor pressure solvent is preferably not a reaction product, although water is necessary for gelation).

Figure 2B:
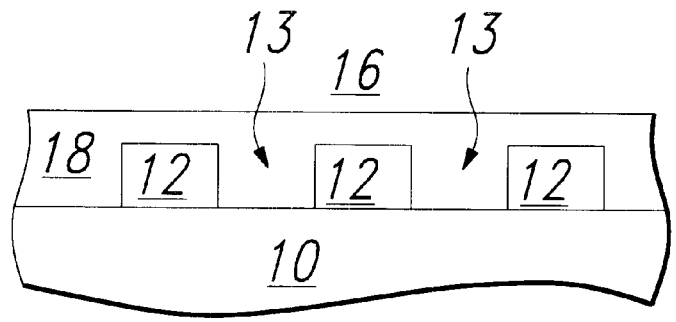

FIG. 2B shows a reduced thickness sol film 18 obtained after substantially all (about 95% or more) of the ethanol has been removed. Film 18 has a known ratio of silicon to pore fluid at the gel point, which is approximately equal to the ratio of TEOS to water and 1-butanol in the as-deposited sol (with minor changes due to continued reactions and incidental evaporation). To the extent that the gel is prevented from collapsing, this ratio will determine the density of the aerogel film which will be produced from the sol thin film.

Film 18 may be dried without substantial densification by one of several methods, including supercritical fluid extraction. However, the preferred method is to surface modify the pore surfaces in the wet gel prior to drying, using a modifying agent such as trimethylchlorosilane, and follow this with slow drying of the film in a controlled atmosphere.

Figure 3:
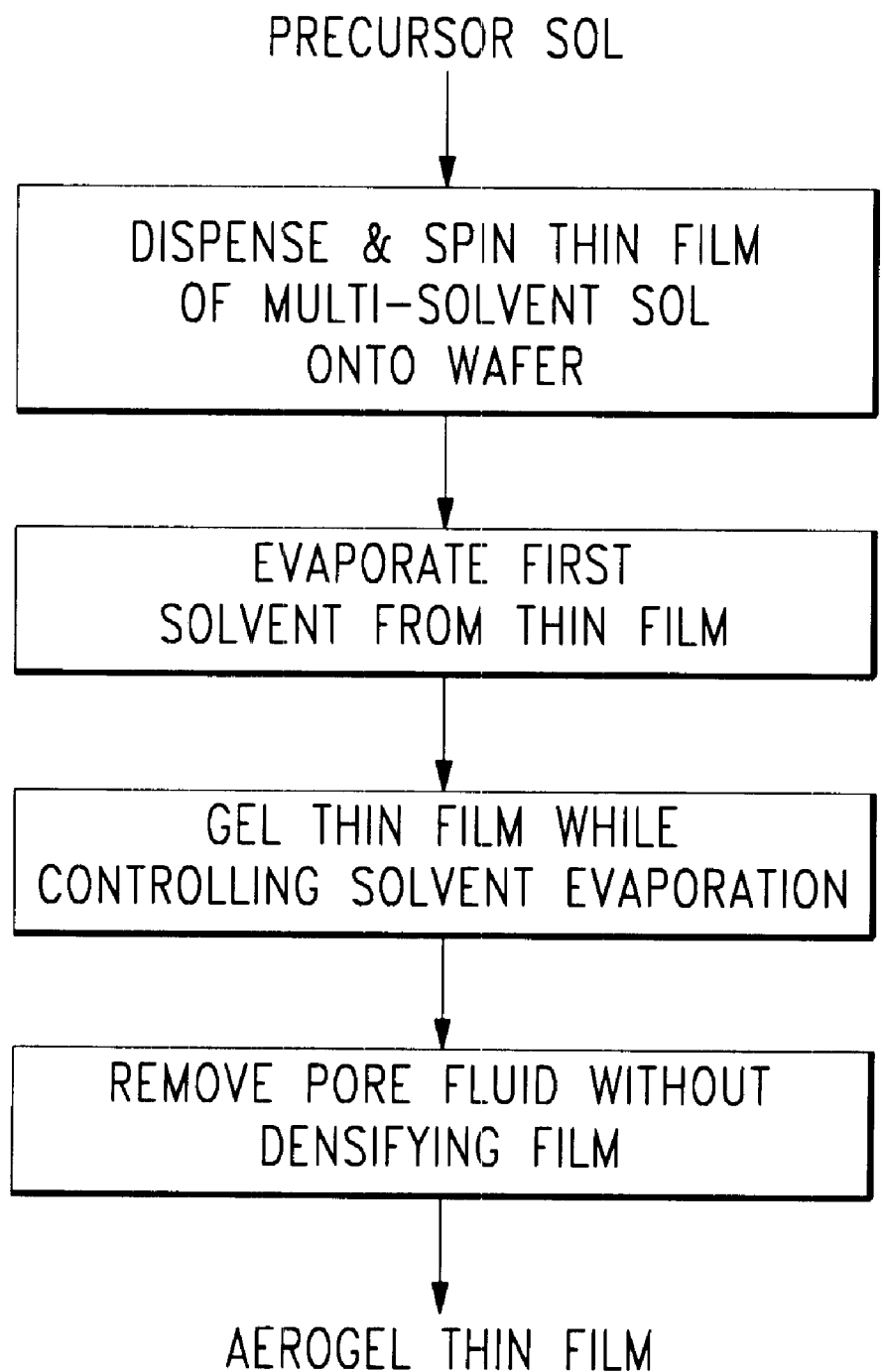
FIG. 3 is a flow chart of a deposition process according to the present invention.

FIG. 3 contains a flow chart of a general method for obtaining an aerogel thin film from a precursor sol according to the present invention. Many of these steps may be modified within the scope of the invention, and other steps can be included to enhance the overall process. For example, the initial thin film may be deposited by other common methods, such as dip-coating or spray-coating instead of spin-coating. Coating and gelation need not be performed in the same chamber or even in the same atmosphere. For instance, coating may be done without a controlled ambient (particularly if the low volatility components do not evaporate rapidly at room conditions), or in an ambient which also prevents evaporation of high volatility components. Also, total pressure and/or temperature may be varied to further control evaporation rates and/or gel time. A post-deposition vapor phase catalyst may be used to speed gelation.

Although TEOS has been used as a representative example, other alkoxides may be used either alone or in combination with TEOS or each other to form a silica network, including tetramethylorthosilicate (TMOS), methyltriethoxysilane (MTEOS), and 1,2-Bis(trimethoxysilyl)ethane (BTMSE). A sol may also include particulate or colloidal silica, may be formed from alkoxides of other metals such as aluminum and titanium, or be formed from organic precursors.

What is claimed is:

1. An aerogel precursor sol comprising:
   an oligomerized metal alkoxide dispersed in a high volatility solvent and a low volatility solvent, said high volatility solvent having a vapor pressure higher than the vapor pressure of said low volatility solvent,
   said low volatility solvent comprising water and at least one water-miscible solvent,
   wherein said metal alkoxide is selected from the group consisting of tetraethylorthosilicate, tetramethylorthosilicate, methyltriethoxysilane, 1,2-Bis(trimethoxysilyl)ethane and combinations thereof, said high volatility solvent comprises ethanol, and said water-miscible solvent comprises an alcohol.

2. The sol of claim 1, wherein said metal alkoxide comprises tetraethylorthosilicate, said high volatility solvent comprises ethanol, and said water-miscible solvent comprises an alcohol.

3. The sol of claim 1, wherein said water-miscible solvent is selected from the group consisting of 1-propanol, 2-propanol, 1-butanol, 2-butanol, tert-butanol, 2-pentanol, 3-pentanol and combinations thereof.

4. An aerogel precursor sol comprising
   an oligomerized metal alkoxide dispersed in a high volatility solvent and a low volatility solvent,
   said high volatility solvent having a vapor pressure higher than the vapor pressure of said low volatility solvent,
   said low volatility solvent comprising water and at least one water-miscible solvent,
   wherein said water-miscible solvent is selected from the group consisting of 1-propanol, 2-propanol, 1-butanol, 2-butanol, tert-butanol, 2-pentanol, 3-pentanol, and combinations thereof.

5. The sol of claim 4, wherein said high volatility solvent comprises ethanol.

6. The sol of claim 4, wherein said metal alkoxide comprises tetraethylorthosilicate.

7. The sol of claim 4, wherein said metal alkoxide comprises tetraethylorthosilicate and said high volatility solvent comprises ethanol.

8. The sol of claim 4, wherein said metal alkoxide is selected from the group consisting of tetraethylorthosilicate, tetramethylorthosilicate, methyltriethoxysilane, 1,2-Bis(trimethoxysilyl)ethane and combinations thereof.

* * * * *